(12) United States Patent
Zorian et al.

(10) Patent No.: US 7,415,640 B1
(45) Date of Patent: Aug. 19, 2008

(54) METHODS AND APPARATUSES THAT REDUCE THE SIZE OF A REPAIR DATA CONTAINER FOR REPAIRABLE MEMORIES

(75) Inventors: Yervant Zorian, Santa Clara, CA (US); Gevorg Torjyan, Yerevan (AM); Karen Darbinyan, Fremont, CA (US)

(73) Assignee: Virage Logic Corporation, Fremont, CA (US)

( * ) Notice: Subject to any disclaimer, the term of this patent is extended or adjusted under 35 U.S.C. 154(b) by 595 days.

(21) Appl. No.: 10/684,793

(22) Filed: Oct. 13, 2003

(51) Int. Cl.
*G11C 29/00* (2006.01)

(52) U.S. Cl. .................. 714/711; 714/718; 714/723; 365/200; 365/201

(58) Field of Classification Search ............... 714/711
See application file for complete search history.

(56) References Cited

U.S. PATENT DOCUMENTS

| | | | | |
|---|---|---|---|---|
| 5,204,836 A * | 4/1993 | Reed | ............... | 365/200 |
| 5,350,940 A * | 9/1994 | Rona | ............... | 257/402 |
| 5,831,917 A * | 11/1998 | Vollrath | ............... | 365/200 |
| 6,249,465 B1 * | 6/2001 | Weiss et al. | ............... | 365/200 |
| 6,577,156 B2 * | 6/2003 | Anand et al. | ............... | 326/37 |
| 6,603,690 B1 * | 8/2003 | Chen et al. | ............... | 365/200 |
| 6,804,156 B2 * | 10/2004 | Ito | ............... | 365/201 |
| 6,822,912 B2 * | 11/2004 | Shimizu et al. | ............... | 365/200 |
| 2004/0153900 A1 * | 8/2004 | Adams et al. | ............... | 714/710 |

OTHER PUBLICATIONS

Ouellette, M.R.; Anand, D.L.; Jakobsen, P. "Shared fuse macro for multiple embedded memory devices with redundancy". Custom Integrated Circuits, 2001, IEEE Conference on. May 6-9, 2001 pp. 191-194.*

Monica Lobetti Bodoni, et al., "An Effective Distributed BIST Architecture for RAMs", IEEE European Test Workshop, 2000 (pp. 1-6).

Chauchin Su, et al., "A Computer Aided Engineering System for Memory BIST", DAC, 2001 (pp. 1-4).

Yervant Zorian, et al., "Embedded-Memory Test and Repair: Infrastructure IP for SoC Yield", IEEE CS and IEEE CASS, May-Jun. 2003 (pp. 58-66).

\* cited by examiner

*Primary Examiner*—Cynthia Britt
*Assistant Examiner*—Steve Nguyen
(74) *Attorney, Agent, or Firm*—Rutan & Tucker LLP

(57) ABSTRACT

Various methods and apparatuses are described in which a repair data container may store a concatenated repair signature for multiple memories having one or more redundant components associated with each memory. A processor contains redundancy allocation logic to execute one or more repair algorithms to generate a repair signature for each memory. The repair data container may store actual repair signatures for each memory having one or more defective memory cells detected during fault testing and dummy repair signatures for each memory with no defective memory cells. The processor may contain logic configured to compress an amount of bits making up the concatenated repair signature, to decompress the amount of bits making up the concatenated repair signature, and to compose the concatenated repair signature for all of the memories sharing the repair data container. The repair data container may have an amount of fuses to store the actual repair signatures for an adjustable subset of the multiple memories.

35 Claims, 7 Drawing Sheets

METHODS AND APPARATUSES THAT REDUCE THE SIZE OF A REPAIR DATA CONTAINER FOR REPAIRABLE MEMORIES

NOTICE OF COPYRIGHT

A portion of the disclosure of this patent document contains material that is subject to copyright protection. The copyright owner has no objection to the facsimile reproduction by anyone of the software engine and its modules, as it appears in the Patent and Trademark Office Patent file or records, but otherwise reserves all copyright rights whatsoever.

FIELD OF THE INVENTION

Embodiments of the invention generally relate to the field of the self-repairable memories. More particularly, an aspect of an embodiment of the invention relates to the field of the self-repair of the embedded memories using an embedded repair data container to store the repair data.

BACKGROUND OF THE INVENTION

Random defects occurring during the manufacturing of an integrated circuit memory device can render non-redundant elements of an integrated circuit memory device, such as a column of memory cells, row of memory cells, etc., defective. For example, particle contamination during the manufacturing process may cause broken or shorted out columns and bit defects.

Redundant elements in an integrated circuit memory device, such as redundant columns or rows of memory cells, are used to compensate for these random defects. Initial testing of an integrated circuit memory occurs after the manufacturing process. During initial testing of an integrated circuit memory device, defective elements are replaced by non-defective elements referred to as redundant components. Thus, redundant elements of memory cells may be used in a scheme to replace defective non-redundant columns, discovered during initial testing of the integrated circuit memory device. The use of redundant elements is important in increasing the overall yield of an integrated circuit memory device.

Defective cells in a memory are typically replaced by a redundant row or column of memory cells. Typically, one fuse exists per each redundant memory row, and each memory column. These fuses are typically physically located with in the memory block on the chip.

The information stored in the fuses of a fuse box is typically used to repair the memories during field operations. Logic loads the information from the fuse box to the memories. Multiple memories may share the fuse box. Typically, a large percentage of the repair resources remain unused, especially in a system with a large number of memories having a small storage capacity, like register file arrays.

A fuse box containing laser fuses typically occupies a significant area on a system on a chip. Further, the fuses in the fuse box typically provide no other functionality besides to store the control bits allocating redundant components associated with each particular memory. Therefore, some manufacturers would be interested in reducing the physical space taken up by the fuse box on a system on a chip.

SUMMARY OF THE INVENTION

Various methods and apparatuses are described in which a repair data container may store a concatenated repair signature for multiple memories having one or more redundant components associated with each memory. A processor contains redundancy allocation logic to execute one or more repair algorithms to generate a repair signature for each memory. The repair data container may store actual repair signatures for each memory having one or more defective memory cells detected during fault testing and dummy repair signatures for each memory with no defective memory cells. The processor may contain logic configured to compress an amount of bits making up the concatenated repair signature, to decompress the amount of bits making up the concatenated repair signature, and to compose the concatenated repair signature for all of the memories sharing the repair data container. The repair data container may have an amount of fuses to store the actual repair signatures for an adjustable subset of the multiple memories.

BRIEF DESCRIPTION OF THE DRAWINGS

The drawings refer to embodiments of the invention in which.

Figure 1:
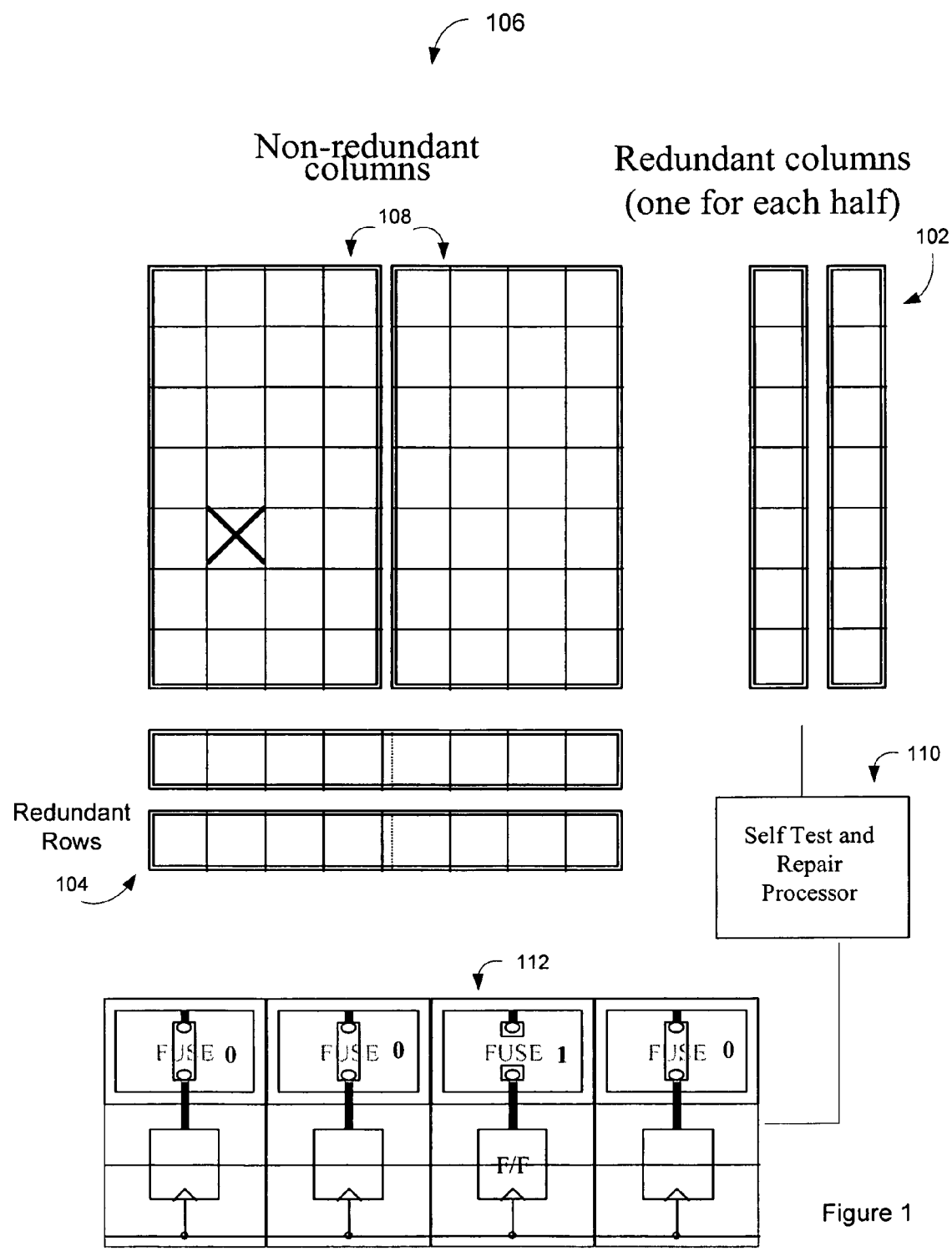
FIG. 1 illustrates a block diagram an embodiment of a memory array having redundant components including redundant columns of memory cells and redundant rows of memory cells.

While the invention is subject to various modifications and alternative forms, specific embodiments thereof have been shown by way of example in the drawings and will herein be described in detail. The invention should be understood to not be limited to the particular forms disclosed, but on the contrary, the intention is to cover all modifications, equivalents, and alternatives falling within the spirit and scope of the invention.

DETAILED DISCUSSION

In the following description, numerous specific details are set forth, such as examples of specific data signals, named components, connections, number of memories, etc., in order to provide a thorough understanding of the present invention. It will be apparent, however, to one of ordinary skill in the art that the present invention may be practiced without these specific details. In other instances, well known components or methods have not been described in detail but rather in a block diagram in order to avoid unnecessarily obscuring the present invention. Further specific numeric references such as first memory, may be made. However, the specific numeric reference should not be interpreted as a literal sequential order but rather interpreted that the first memory is different than a second memory. Thus, the specific details and implementations set forth are merely exemplary. The specific details and implementations may be varied from and still be contemplated to be within the spirit and scope of the present invention. The term coupled is defined as meaning connected either directly to the component or indirectly to the component through another component.

In general, various methods and apparatuses are described in which a repair data container stores a concatenated repair signature for multiple memories having one or more redundant components associated with each memory. The one or more redundant components include at least one redundant column of memory cells. A processor contains redundancy allocation logic to execute one or more repair algorithms to generate a repair signature for each memory. The repair data container may store actual repair signatures for each memory having one or more defective memory cells detected during fault testing. The redundancy components which wouldn't be reconfigured may be skipped in the repair container and dummy repair signatures for each memory with no defective memory cells may be generated by the reconfiguration data generation logic. Multiple processors having logic to test and repair memories connected to those processor may exist on a system on a chip. The repair data container may store a concatenated repair signature for the memories connected to those multiple processors. The processor may contain logic configured to compress an amount of bits making up the concatenated repair signature, to decompress the amount of bits making up the concatenated repair signature, and to compose the concatenated repair signature for all of the memories sharing the repair data container. The repair data container may have an amount of fuses to store the actual repair signatures for an adjustable subset of the multiple memories.

FIG. 1 illustrates a block diagram an embodiment of a memory array having redundant components including redundant columns of memory cells and redundant rows of memory cells. The example memory array 106 contains two banks of non-redundant memory cells 108, two redundant columns of memory cells 102, and two redundant rows of memory cells 104. Each of the redundant components 102, 104 may have a fuse 112 associated with that redundant component. Each bank of non-redundant memory cells 108 may also have fuses 112 associated with that bank. The fuses 112 indicate whether a fault exists with one or more memory cells in the banks of non-redundant memory columns and rows and whether or not one of the associated redundant components has been assigned to replace the faulty memory cell(s). A self test and repair processor 110 may generate reconfiguration data that substitutes a redundant component for a non-redundant component containing a defective memory cell based on the information stored in the fuses 112.

A memory having a large kilobyte storage capacity such as four megabytes may have a large amount of redundant components such as sixteen redundant memory columns and eight redundant memory rows. A memory having a small kilobyte storage capacity such as two hundred and fifty-six kilobytes may have a few redundant components, such as one redundant column and one redundant row. When a memory array is manufactured, the larger the kilobyte storage capacity of that memory means that the memory contains more memory cells. Thus, a higher probability exists that a greater quantity of the memory cells will be defective in a four megabyte memory array than, for example, in a two hundred and fifty-six kilobyte memory array. The number of redundant components may be directly proportional to the kilobyte or megabyte capacity of that particular memory.

When numerous small memories are embedded on a system on a chip, a high probability exists that merely a small portion of the memories on that chip actually contains one or more defective memory cells. Although every memory on the chip may contain redundant components to repair the memory in case one or more defective memory cells are detected in that memory, in practice merely a small percentage will actually contain a defective memory cell and thus use a repair signature to properly allocate the redundant components associated with that memory.

Figure 2:
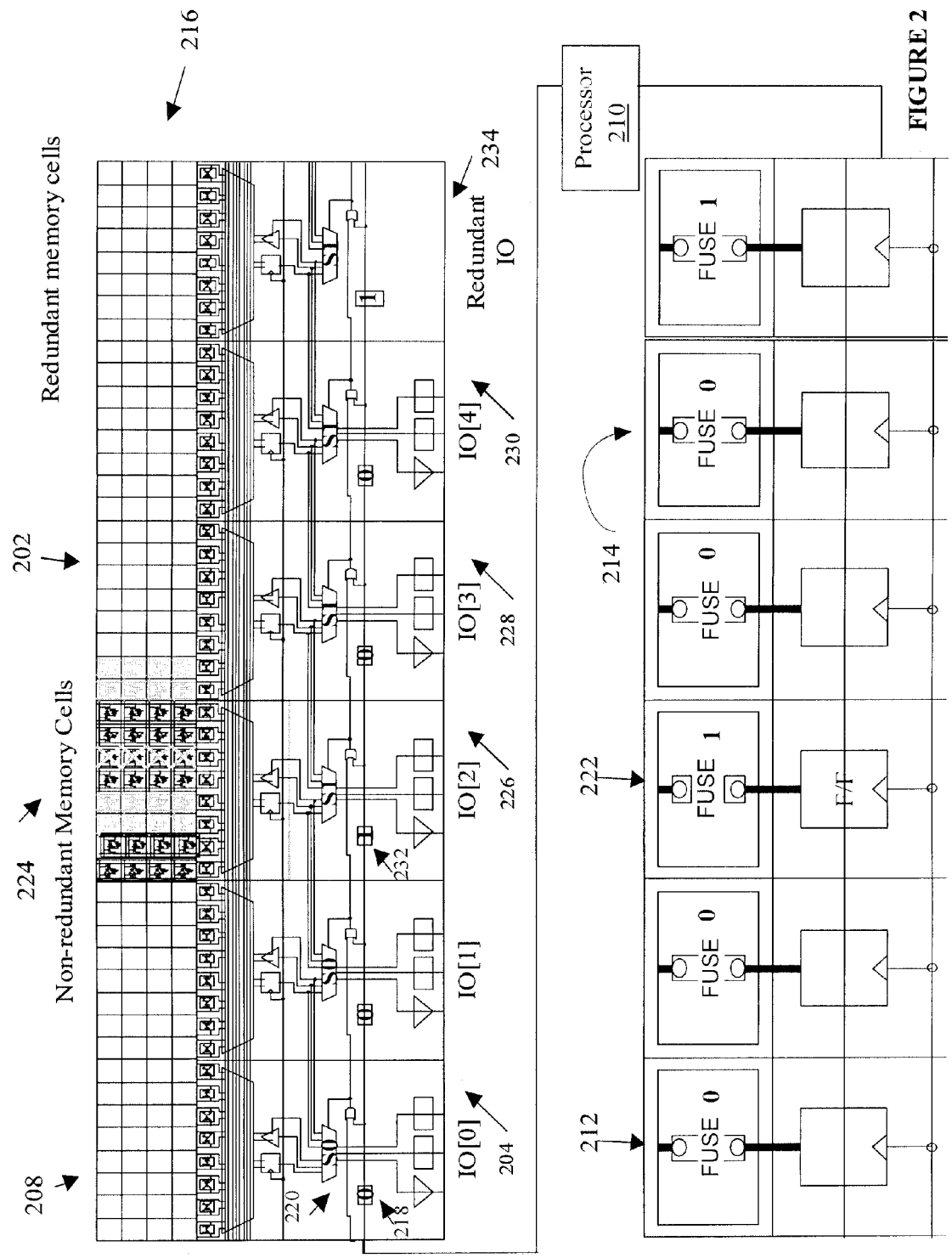
FIG. 2 illustrates a block diagram of an embodiment of a memory having redundant components and a fuse block external to the memory block.

FIG. 2 illustrates a block diagram of an embodiment of a memory having redundant components and a fuse block external to the memory block. The example memory 202 contains several input-output circuits (IO), such as the first non-redundant input output circuit 204. The example memory 202 has columns and rows of memory cells coupling to each of the input-output circuits, such as a first group of columns of non-redundant memory cells 208. Each input output-circuit also couples a corresponding fuse via the processor 210. A fuse, such as the first fuse 212, is a non-volatile storage device, such as a Flash memory cell, an Electrically Programmable Read Only Memory cell, a one-time programmable memory cell, a few-time programmable memory cell, a laser fuse, or other similar component, that permanently stores fault information to perform the function of a fuse. All of the fuses may be contained a fuse box 214 located external to the memory block 216.

Each input output circuit contains a scan chain register to receive fault information permanently stored in the corresponding fuse, such as the first scan chain register 218. For example, the first fuse 212 stores a logical 0 bit indicating that a fault has not been detected in any of the memory cells coupled to the first input-output circuit 204. The first scan chain register 218 receives the logical 0 information from the first fuse 212 via the processor 210. Accordingly with no defects detected, the first input-output circuit 204 remains directly coupled to the first group of columns memory cells 208.

A scan chain register directs a multiplexer, such as the first multiplexer 220, to route read and write signals to either the memory cells directly coupled to the input-output circuit or to an adjacent group of memory cells. If a fault is detected in the memory cells directly coupled to a non-redundant input output circuit, then the multiplexers shift read and write operations away from the faulty group of memory cells and toward the group of memory cells coupled to the redundant input-output circuit.

If a defect is detected in one or more of the non-redundant memory cells during testing, then either an external test device or the processor 210 may execute a repair algorithm to generate a repair signature to properly allocate the redundant components 234 associated with the memory 202 to repair the memory 202. Either an external test device or the processor 210 may cause one or more fuses to signify this defect by changing the fuse's status, and thus, permanently store the location of where the defective non-redundant memory cell was detected. For example, the third fuse 222 is blown indicated by the fuse containing a logical 1; thereby, changing to the fuse's state from an inactive level of a logical 0 to an active logical 1. The third fuse 222 is blown to indicate that one or more non-redundant memory cells in the third group of memory cells 224 coupled to the third input-output circuit 226 are defective.

A repair signature may be a compressed or not compressed form representing the logical 1 and 0 bits permanently stored in the fuse box 214. When the processor 210 reads the repair signature stored in the fuse box 214, the processor 210 generates and sends reconfiguration data to be scanned into each of the scan chain register. The processor 210 loads the repair signature in and scans the reconfiguration data into the scan chain registers causing each multiplexer to shift away from where the defect exists in the memory cells. In the example, a logical 1 is scanned into the third scan chain register 232 causing the third input output circuit 226, the fourth input output circuit 228, and the fifth input output circuit 230 to coupled to memory cells away from the memory cells directly coupled to the input-output circuit and to the adjacent group of memory cells.

Figure 3:
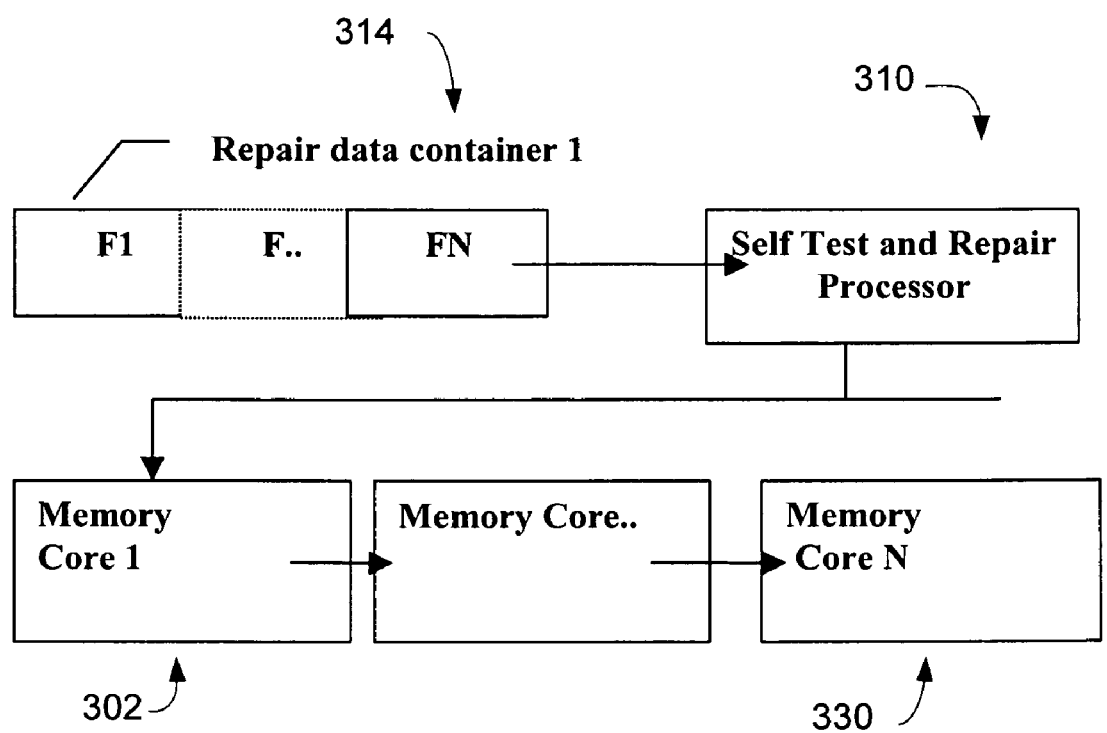
FIG. 3 illustrates a block diagram of an embodiment of a processor having logic configured to test and repair two or more memories electrically connected to that processor.

FIG. 3 illustrates a block diagram of an embodiment of a processor having logic configured to test and repair two or more memories electrically connected to that processor. The processor 310 connects to multiple memory arrays, such as the first memory 302 through the Nth number of memory 330. The processor 310 also connects to a fuse box 314 that stores a concatenated repair signature that repairs all of the memories connected that processor 310. Each of the memories 302-330 has one or more redundant components associated with that memory. The processor 310 contains redundancy allocation logic to execute one or more repair algorithms to generate a repair signature for each memory. The repair data container may be a fuse box 314. The fuse box 314 stores actual repair signatures for each memory having one or more defective memory cells and dummy repair signatures for each memory with no defective memory cells. The concatenated repair signature may be an aggregation of all the repair signatures for each of the memories connected to that processor 310. The processor 310 contains logic configured to compose a concatenated repair signature for all of the memories 302-330 sharing the processor 310 and the fuse box 314. The processor 310 composes a concatenated repair signature in order to store that concatenated repair signature in the fuse box 314. The processor 310 also contains logic configured to decompose the concatenated repair signature to send reconfiguration data into all of the memories 302-330 sharing the fuse box 314. The processor 310 also contains logic configured to compress the repair signature when sending bits to be stored in the fuse box 314.

Figure 4:
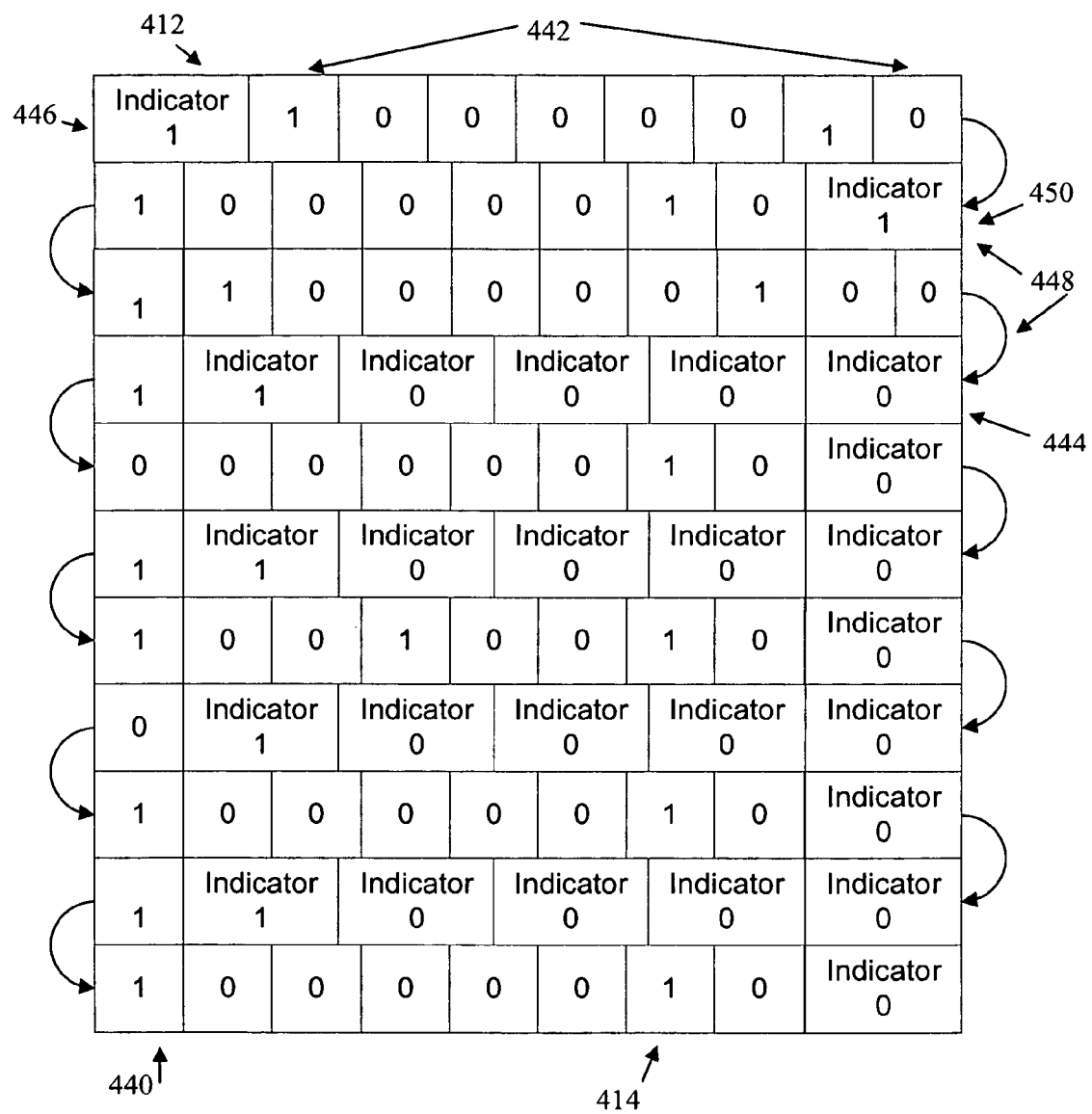
FIG. 4 illustrates a block diagram of an embodiment of a repair data container storing a concatenated repair signature that repairs all of the memories connected the processor.

FIG. 4 illustrates a block diagram of an embodiment of a repair data container storing a concatenated repair signature that repairs all of the memories connected the processor. The repair data container may be a fuse box 414 containing a given amount of fuses such as the first fuse 412 through the eighty-eighth fuse 440. The concatenated repair signature stored in the fuses 412-440 making up the fuse box 414 may be a combination of actual repair signatures and dummy repair signatures. The processor may decompress or manipulate in other ways the information in the repair signature to generate the reconfiguration data sent to the scan chain registers in each memory.

Referring to FIG. 3, the reconfiguration data sent by the processor is scanned into the scan chain registers of each memory 302, 330. The reconfiguration data is the logical 1 and 0 bits that direct each memory on how to utilize their redundant memory cells.

Referring to FIG. 4, each fuse may store an indicator bit, such as a first indicator bit 446, used to denote whether the next sequentially stored repair signature is an actual repair signature or a dummy repair signature. The first indicator bit 446 is associated with the initial memory that shares that fuse box 414. A logical 1 is present in the first indicator bit 446 indicating that the flag is active. Since the flag is active, the next eight bits are associated with the repair signature for the initial memory. An actual repair signature, such as a first actual repair signature 442, may be an identifier bit and a compressed or not compressed form of the logical 1 and 0 bits permanently stored in the fuse box 414. A dummy repair signature for each memory with no defect, such as a first dummy repair signature 444, may be a single identifier bit. The dummy repair signature consisting of a single indicator bit may cause 1) the bypassing of loading reconfiguration data into the scan chain registers of each memory if the system resets the content of the scan chain registers upon powering up, 2) a loading of a pre-stored series of bits that loads into the scan chain registers such as all logical 0s, or 3) a similar process that does not cause a substitution of a redundant component for a non-redundant component in a memory having no detected defects. A dummy signature may also be series of 1s and 0s stored in the fuse box or in a processor.

In an embodiment, an indicator bit may be a single bit, a multi bit pair, or some other similar method to designate that the contents of that bit are designated to a specific memory and whether a defect is contained in that memory or not. In a multi-bit pair the first bit such as a status flag indicates that it is an indicator. In a single bit indicator, the position of the bit is detected by the processor, which signifies that the bit is an indicator bit rather than a part of the data in the repair signature. If this initial bit is a logical 1, then the next bits that follow are part of part of the data in the actual repair signature. Similarly, use of a logical 1 as an active indication is only an example and a logical 0 or some other scheme could be used as well.

Figure 5:
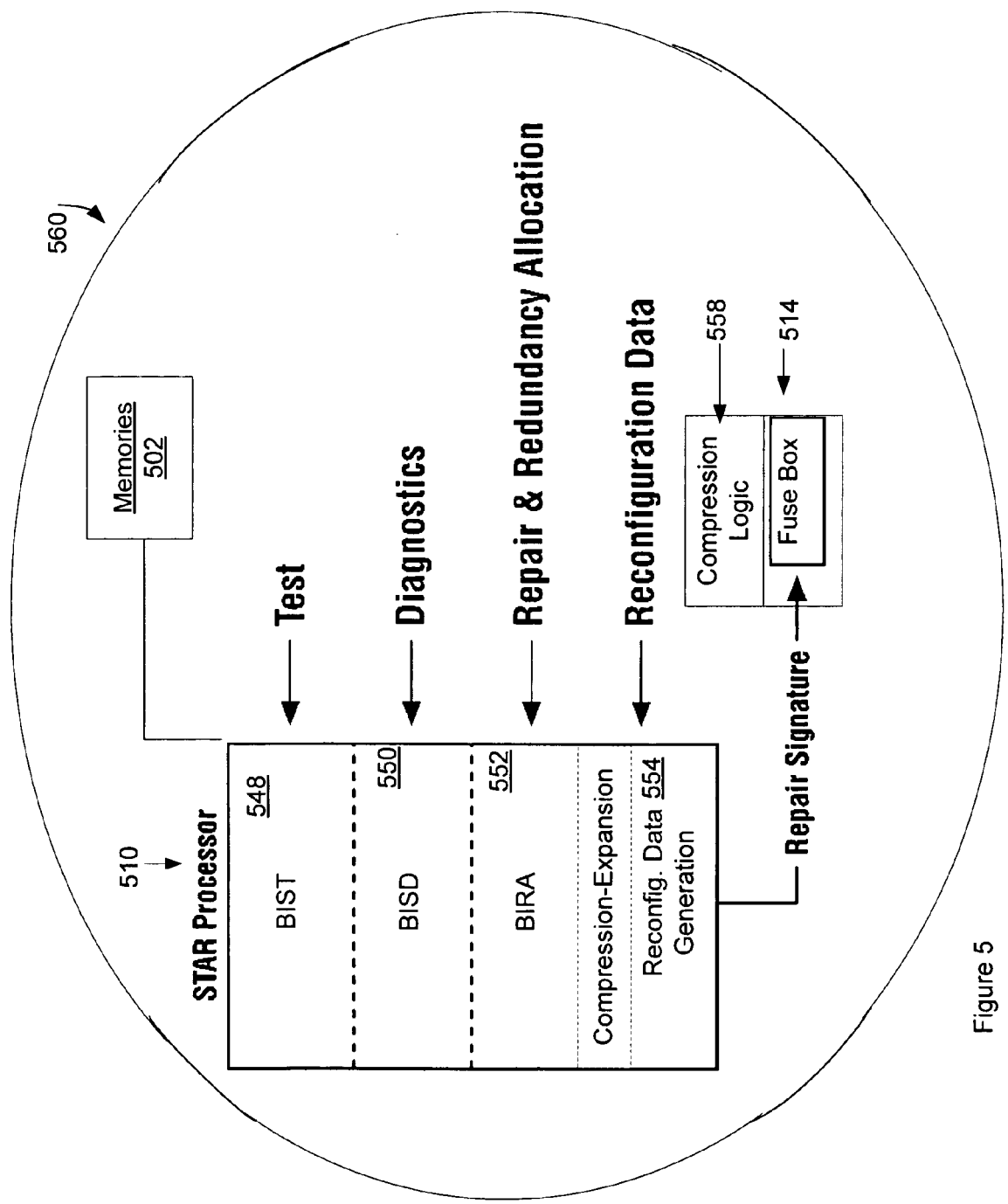
FIG. 5 illustrates a block diagram of an embodiment of a processor containing multiple engines such as a built in self-test engine, a built-in self-diagnosis engine, a built-in redundancy allocation engine, and a reconfiguration data engine.

FIG. 5 illustrates a block diagram of an embodiment of a processor containing multiple engines such as a built in self-test engine, a built-in self-diagnosis engine, a built-in redundancy allocation engine, and a reconfiguration data engine. The processor 510 may be configured to be a self-test and repair processor. The processor 510 contains control logic and instructions such as several function orientated engines. The BIST engine 548 (Built-in Self-Test) performs tests, e.g. foundry-specific test algorithms, designed to detect defects in the memories. The BISD engine 550 (Built-in Self-Diagnosis) determines the location of the memory defects (if any) and provides error logging and scan-out failure date if required for failure analysis. The BIRA engine 552 (Built-in Redundancy Allocation) analyzes memory address locations of a memory array and allocates available redundant components to substitute for non-redundant components associated with a defect. The BIRA engine 552 identifies and allocates available redundant rows of memory cells and redundant columns of memory cells in order to determine the optimum redundancy scheme when a failure occurs. The processor 510 enables a complete embedded memory self-test and repair function to be included on a system on a chip 560. The processor 510 increases the yield of useable memories 502 on that chip 560 by repairing defective memory components.

The self-test and repair processor 510 may have a reconfiguration data engine 554 configured to compress and decompress the configuration data/repair signature for the multiple memories sharing that fuse box 514 and that processor 510. The reconfiguration data engine 554 decompresses a repair signature coming from the fuse box 514 into reconfiguration data that is serially sent into the scan chain registers of the memories 502. The reconfiguration data engine 554 also compresses the bits making up the concatenated repair signature to be stored permanently in the fuse box 514.

Compression/decompression logic 558 may also be located around the fuse box 514 and configured to compress an amount of bits making up a repair signature and decompress the amount of bits making up a repair signature. The compression/decompression logic 558 may implement a number of compression algorithms and schemes, such as a logarithmic compression of the data bits making up the repair signature.

In a large memory, such as a four megabyte memory, five hundred and twelve columns of memory cells may exist. Therefore, the reconfiguration data consists of five hundred and twelve bits of logical 1s and 0s. One bit corresponding to each column of memory cells and each of those bits being stored in a scan chain register associated with a particular column of memory cells.

The reconfiguration data engine 554 or the compression logic 558 may apply a compression algorithm to a digitized signal representing the reconfiguration data. For example, the compression logic may logarithmically compress the five hundred and twelve reconfiguration data bits. Thus, if five hundred and twelve bits exist in the reconfiguration data, then the compressed form of the repair signature would only consist of nine bits because $2^9=512$. Thus, the actual repair signature permanently stored in the fuse box may only be nine bits long rather then five hundred and twelve bits long.

The reconfiguration data engine 554 transfers the scanned reconfiguration data to the scan chain registers in the memories 502. The reconfiguration data engine 554 also contains the logic configured with the number of columns in each memory 502 that shares that processor 510. The logic assists with determining the length repair signature because multiple memories may share a single self-test and repair processor and each memory may be of a different size, and thus, have a different length repair signature. The reconfiguration data engine 554 also contains the logic configured to keep track of which memory its currently loading reconfiguration data to.

The compression of the reconfiguration data is a first level of compression on the storage of the repair signatures belonging to the memories sharing a single fuse box. Two levels of compression may exist to decrease the number of non-volatile fuses used to store the concatenated repair signature.

In some prior techniques, a one-to-one mapping exists between the number of memory columns and rows and the number of fuses. If five hundred and twelve columns of memory cells exist per memory, then five hundred and twelve bits of information exist per memory. Thus, five hundred and twelve bits of information per memory multiplied by five hundred memories on the chip would equal two hundred and fifty-six thousand bits stored in fuses. The aggregated reconfiguration data would be two hundred and fifty-six thousand bits in length and the sum of all of the individual repair signatures would be two hundred and fifty-six thousand bits in length.

The first level of compression occurs with the reconfiguration data engine 554 inside the processor 510 to compress logarithmically, or some other similar way, the repair configuration data into a compressed repair signature. When the compressed, for example, nine bits representing a repair signature is expanded by the reconfiguration data engine 554, then a five hundred and twelve bit in length reconfiguration data signal is generated and then sent into the corresponding memory. If, for example, five hundred memories share the fuse box 514 and the memories were all the same size, then the fuse box 514 stores a nine bit repair signature for each one of those individual five hundred memories. Thus, the amount of fuses required to store the repair signature in the fuse box 514 after the compression algorithm is applied would be nine bits×five hundred memories equaling four thousand five hundred non-volatile fuses.

Some manufacturers would be interested in reducing the four thousand five hundred fuses even further to create a smaller amount of physical space taken up by the fuse box 514 on the system on a chip 560. The second level of compression on the storage of the repair signatures belonging to the memories sharing a fuse box is designing the fuse box 514 with an amount of fuses to store the actual repair signatures for merely an adjustable subset of the memories sharing that fuse box.

A high probability exists that not every redundant element is going to be utilized and not every memory is going to have one or more defective memory cells. Therefore, after statistically analyzing a system memory on a system on a chip, a designer can determine the maximum percentage of memories that do have one or more defective memory cells after the manufacturing process. The designer may determine that it's highly probable that a certain percentage of the memories, such as 10%, may have one or more defective memory cells. Therefore, 90% of the memories sharing a fuse box will not have a defect.

A designer may not want to create permanently storage capacity to store an actual repair signature for every memory on the chip including those memories without defects. A designer may choose to create enough non-volatile fuses in the fuse box to store actual repair signatures for merely twice the statistical percentage of memories having defective memory cells. In the example, at most 10% of the memories on the chip may have one or more defective memory cells. The designer then creates a fuse box containing an amount of fuses in the fuse box to store the actual repair signatures for merely 20% of the memories on that chip.

Our example before had five hundred memories and a compressed nine bits per repair signature, which equaled the amount of four thousand five hundred fuses contained in the fuse box. After the second level of compression is implemented the fuse box would constructed with approximately 20% of those four thousand five hundred fuses. Therefore, the number of fuses contained in the fuse box may be reduced from four thousand five hundred to approximately fourteen hundred fuses. Five hundred identifier bits for the five hundred memories and nine hundred additional fuses to provide an amount of fuses to store actual repair signatures for 20% of the five hundred memories. Thus, the repair capability for all of the memories on the chip merely exists for a subset of the memories that share that fuse box. In this example, a subset of a maximum of 20% of all the memories on the chip may have an actual repair signature stored in the fuse box. However, if the statistical probability has shown that typically at most 10% of the memories fail, and the repair fuse box has a capability to store actual repair signatures for up to 20% of the memories of the system on a chip, then a very high probability exists that all the memories having a defect will be repaired without the system on the chip having a catastrophic failure due to a lack of repair signature storage capability. The subset of the memories having the capability to be repaired by an actual repair signature is adjustable to any percentage between 0.1% and 99% chosen by the system on a chip designer.

Referring to FIG. 4, the fuse box 414 may contain an amount of fuses 412-440 to store the actual repair signatures for an adjustable subset of the redundant components associated with the memories sharing that fuse box 414. The fuse box 414 stores actual repair signatures for each memory having one or more defective memory cells and indicators, marking whether correspondent memory has defects to be repaired. The fuse box also stores indicator bits for each memory sharing that fuse box. A presence of an active bit in the indicator bits indicates that the fuse box contains an actual repair signature for that memory having a defect.

The fuses 412-440 may be read, and loaded, and unloaded in a serial or other manner. For example, the bit in the far most upper left fuse 412 may be the initial bit that loads from the fuse box 414 to the processor. The first indicator bit 446 would be an identifier bit and the beginning of the concatenated repair signature. The concatenated repair signature for the multiple memories may be composed of indicator bits and repair signature data. Logic in the processor recognizes whether each indicator bit is active or not active. If the indicator bit has a flag that is active, then the next number of bits that follow, corresponding to the length of the repair signature for that particular memory, will be the data that forms the repair signature. The logic in the processor, such as a data lookup table, is configured with how many memories share that processor, the order in which those memories share the processor, the length of the repair signature exists for each of the memories connected to the processor and dummy repair signature for each memory. The processor generates configuration data based upon the repair signature data.

FIG. 4 illustrates the serially stored concatenated repair data signature from left to right then on the next row from right to left in the repair data container. A logical 1 is present in the first indicator bit 446 indicating that the flag is active. Since the flag is active, the next eight bits are associated with the first actual repair signature 442. The logic in the processor is configured to understand that the next bit that follows the first repair signature 442 is another indicator bit. The logic examines the next indicator bit and depending upon its active or non-active status either generates a dummy repair signature for the next memory or loads the amount of bits corresponding to the actual repair signature for the next memory. In the example string of stored bits, the second indicator bit is a logical 1 and is associated with the second memory. The second repair signature 448 has an active indicator bit followed by eighteen bits that form the compressed or not compressed actual repair signature. The logic in the processor is configured to know that the length of the repair signature associated with the second memory is eighteen bits in length rather than nine bits in length because the second memory in the data table is annotated as having that amount of bits. Therefore, the next eighteen bits following the second identifier bit 450 are associated with the repair signature of the second memory.

The next four indicator bits have an inactive level (i.e. logical 0's) and are associated with memories three, four, five, and six respectively. Thus, memories three, four, five, and six have dummy repair signatures for those memories.

The dummy signature may cause the logic in the processor to generate a reset signal to the scan chain registers in the corresponding memory such that all logical 0s are stored in those scan chain. Similarly, a dummy signature may cause the logic in the processor to simply to bypass loading of reconfiguration data into the memory corresponding to this identifier bit. A dummy signature may also cause the logic in the processor implement another similar process that does not cause a substitution of a redundant component for a non-redundant component in the memory corresponding to this identifier bit.

Alternatively, the fuse box may have a dedicated field for each memory sharing that fuse box. A presence of an active bit in the dedicated field indicates that the fuse box contains an actual repair signature for that memory having a defect. The processor may reference the dedicated field when generating actual and dummy repair signatures.

As noted, a designer may choose to elect to have the repair capability for the subset of memories sharing that fuse box set at anywhere from 0.1% to 99% of the memories that share that fuse box. The maximum number of memories that may be repaired may not be exactly quantified because just a total number of fuses exist and the length of the repair signature may vary in the population of memories sharing that fuse box. In an embodiment, once that total number of fuses is used up by repair signatures for a given amount of memories sharing that fuse box, then the further memories sharing that fuse box may no longer be repaired.

Referring to FIG. 5, the processor 510 may also contain field repair logic. A repair may be performed in the field with software on each power up and the repair signature generated in the field may augment the repair signature coming from the fuse box. The processor 510 may also contain logic to update the stored repair signature based upon defects detected in the field.

Figure 6:
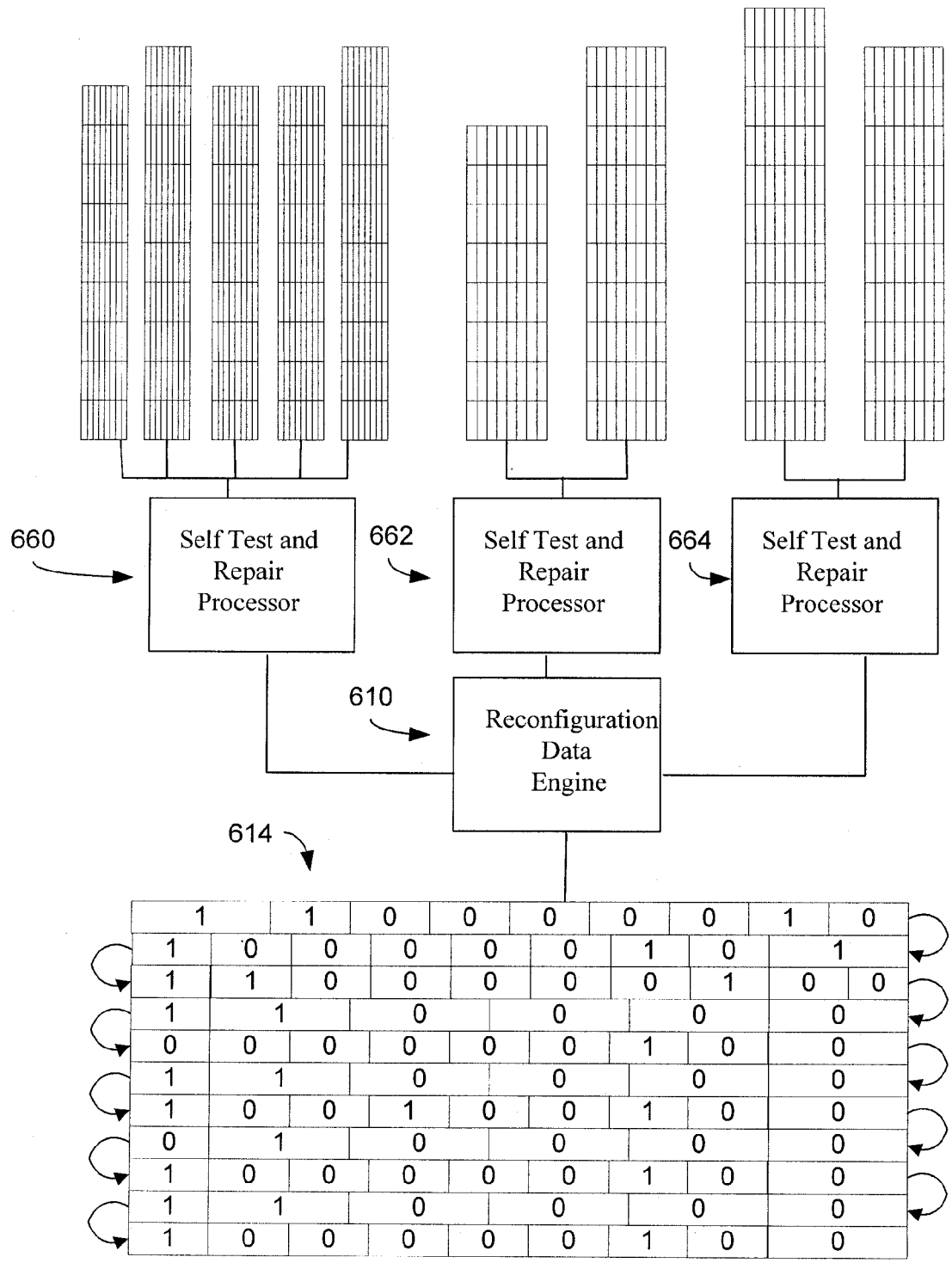
FIG. 6 illustrates a block diagram of a reconfiguration data engine shared by a first, second, and third processor, which all share the same fuse box to store a concatenated repair signature.

FIG. 6 illustrates a block diagram of a reconfiguration data engine shared by a first, second, and third processor, which all share the same fuse box to store a concatenated repair signature. The first processor 660, the second processor 662, and the third processor 664 are each shared by multiple memories each. The reconfiguration data engine 610 couples to the fuse box 614. The first processor 660 has logic configured to test and repair the multiple memories electrically connected to that first processor 660. The second processor 662 has logic configured to test and repair the multiple memories electrically connected to that second processor 662. The third processor 664 has logic configured to test and repair the multiple memories electrically connected to that third processor 664. The reconfiguration data engine 610 has logic configured to know how many memories are connected to each processor 660-664. The reconfiguration data engine 610 contains logic to generate a concatenated repair signature that repairs the memories connected the first processor 660, second processor 662, as well as the memories connected to the third processor 664. Thus, the memories from the first, second, and third processor 660-664 all share the same fuse box 614 and the reconfiguration data engine 610.

The logic in the reconfiguration data engine 610 may track when generating reconfiguration data from repair signatures which particular processor it's on and cross-reference to a data table that tells it how many memories are sharing that particular processor. The reconfiguration data engine 610 may have logic configured to keep track of how many memories are associated with each of the processors that are sharing that reconfiguration data engine 610. The logic in the reconfiguration data engine 610 lets the reconfiguration data engine know how many memories are sharing the first processor 660, how many memories are sharing the second processor 662, and how many memories are sharing the third processor 664. Based upon this knowledge, the reconfiguration data engine 610 may determine exactly which memory to send the reconfiguration data as soon as the repair signature loads into the reconfiguration data engine 610 from the fuse box 614.

The reconfiguration data engine 610 may have a data compression/expansion circuit. The first processor 610 may send the compressed repair signature to each processor. Based upon the tracking information, the each processor 660-664 may determine exactly which memory to send the reconfiguration data to.

Note, the repair signature associated with each memory may vary in length depending upon the size of the memory. The compressed repair signature may be, for example, four bits, nine bits, twelve bits, etc., depending upon the actual kilobyte capacity of the memory.

A designer may now allocate one area to store all of the non-volatile fuses for every memory on the chip. After, the application of the two levels of compression on the storage of the repair signatures, the physical space occupied by that fuse box may be as small as a previous fuse box servicing merely a few memories.

The minimum amount of fuses in the repair data container may be calculated as

Amount of fuses=$C$max+$C$size times $k$,

Where Csize is the length of the repair signatures for all of the memories sharing the repair data container after any kind of compression algorithm is applied, Cmax is the number of identifier bits assigned for each of the memories, typically 1, and k is the percent reduction coefficient determined by the designer.

Figure 7:
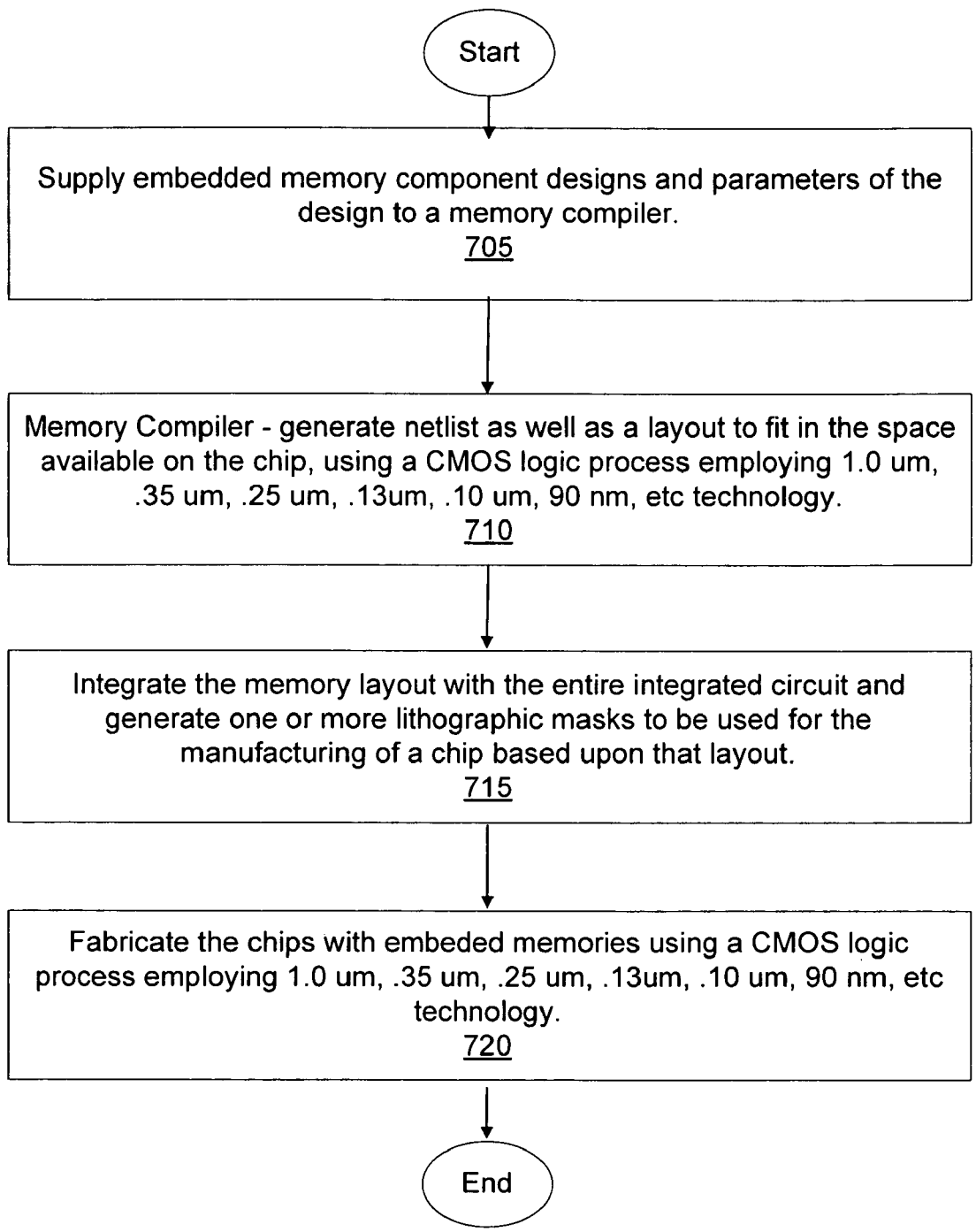
FIG. 7 illustrates an example process of generating an embedded memory with an amount of fuses to store the actual repair signatures for merely an adjustable subset of the memories sharing a repair data container from designs of memory components with an embodiment of a memory compiler.

FIG. 7 illustrates an example process of generating an embedded memory with an amount of fuses to store the actual repair signatures for merely an adjustable subset of the memories sharing a repair data container from designs of memory components with an embodiment of a memory compiler.

In block 705, the designs for each processor and memory component for the embedded memory are supplied to the memory compiler, as well as other design parameters such as the number of columns and number of rows of the array, the available size on the chip and other parameters. Thus, the designs for one or more memories that share a repair data container may be supplied to the memory compiler. A memory compiler may be a software program comprised of multiple algorithms and designs for the purpose of generating a circuit design and a layout in a space available on a target chip. The set of application-specific algorithms and interfaces of the memory compiler may be used by system IC integrators to rapidly create hundreds of silicon-proven memory cores. The memory compiler receives the memory component designs and utilizes those memory component designs in conjunction with memory circuit designs to optimize a circuit design and layout in the space available on a target chip.

In block 710, the memory compiler generates a netlist and a layout targeted to fit in the space available on a target chip. The memory compiler stores the data representing the embedded memory typically on a machine-readable medium. The memory compiler selects the memory component building blocks so that they are sized appropriate for the targeted fabrication technology. The memory compiler then provides the memory layout to be used to generate one or more lithographic masks to be used in the fabrication of that embedded memory. The memory compiler also provides a netlist for verification of the embedded memory. The memory compiler allows the logic for the BIST, redundancy allocation, etc., to be defined in the hard layer, i.e. in the layout process rather than having to wait to define a portion of the BIST in the soft register transfer level.

In block 715, the memory layout generated is integrated with the rest of the layout for the chip and a machine generates the lithographic masks that contain the information necessary for the fabrication of a functional device. The machine generates one or more lithographic masks to be used to transfer that circuit design onto the chip. The memory solution for embedded applications integrates easily with the standard single poly CMOS processes.

In block 720, a fabrication facility fabricates the chips with the embedded memories using the lithographic masks generated from the memory compiler's circuit design and layout. Fabrication facilities may use a standard CMOS logic process having minimum line widths such as 1.0 um, 0.50 um, 0.35 um, 0.25 um, 0.18 um, 0.13 um, 0.10 um, 90 nm, or less, to fabricate the chips. The size of the CMOS logic process employed typically defines the smallest minimum lithographic dimension that can be fabricated on the chip using the lithographic masks, which in turn determines minimum component size. In an embodiment, light is shown through these lithographic masks onto the chip to transfer the circuit design and layout for the embedded memory onto the chip itself. In an embodiment, the memory compiler is designed for embedded applications in the standard CMOS logic process.

In one embodiment, the software used to facilitate the memory compiler can be embodied onto a machine-readable medium. A machine-readable medium includes any mechanism that provides (e.g., stores and/or transmits) information in a form readable by a machine (e.g., a computer). For example, a machine-readable medium includes read only memory (ROM); random access memory (RAM); magnetic disk storage media; optical storage media; flash memory devices; DVD's, EPROMs, EEPROMs, FLASH, magnetic or optical cards, or any type of media suitable for storing electronic instructions. Slower mediums could be cached to a faster, more practical, medium.

In an embodiment, an example memory compiler may comprise the following. A graphic user interface, a common set of processing elements, and a library of files containing design elements such as circuits, control logic, and cell arrays that define the complier. In an embodiment, object code in a set of executable software programs.

As noted, in an embodiment, a designer chooses the specifics of the memory configuration to produce a set of files defining the requested memory instances. A memory instance may include front end views and back end files. The front end views support documentation, simulation, debugging, and testing. The back end files, such as a layout, physical LEF, etc are for layout and fabrication.

The memory complier outputs may include Behavioral Models and Test Benches (Verilog, VHDL), •Timing Models (TLF, .Lib and STAMP), Test Models (MemBIST, FastScan), Structural Netlists (EDIF, Spice), Power Models (Watt-Watcher, ALF), Floorplanning and Place&Route Models, Physical LEF, FRAM, Layout (GDS), Datasheets (including power, timing, and area specifications, as well as other outputs. When programming occurs or if a revision is needed, the designer merely has to redesign the block, a few metal and via masks.

Some portions of the detailed descriptions above are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the above discussions, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers, or other such information storage, transmission or display devices.

While some specific embodiments of the invention have been shown the invention is not to be limited to these embodiments. For example, most functions performed by electronic hardware components may be duplicated by software emulation. The invention is to be understood as not limited by the specific embodiments described herein, but only by scope of the appended claims.

We claim:

1. An apparatus, comprising:
   two or more memories having one or more redundant components associated with each memory, the one or more redundant components include at least one redundant column of memory cells;
   a first processor on-chip with the two or more memories and containing redundancy allocation logic to execute one or more repair algorithms to generate a repair signature for each of the two or more memory; and
   a repair data container on-chip with the two or more memories and to store a concatenated repair signature, composed by the first processor, that comprises a string of bits arranged as a plurality of fields, one field for each of the memories, (1) for each memory having one or more defective memory cells detected during fault testing, the field consists of (a) a single bit that identifies the memory, followed by (b) a plurality of bits being compressed, repair signature data for the memory, and (2) for each memory with no defective memory cells, the field consists of a single bit that identifies the memory.

2. The apparatus of claim 1, wherein the repair data is in a fuse box located on the same chip but external to area occupied by the two or more memories.

3. The apparatus of claim 1, wherein for each memory with no defect the identifier bit directs the processor to bypass loading of reconfiguration data into the memory corresponding to this identifier bit.

4. The apparatus of claim 1, wherein for each memory with no defect the identifier bit directs the processor to load a pre-stored series of reconfiguration data bits into scan chain registers of the memory corresponding to this identifier bit but the content of the reconfiguration data bits does not cause a substitution of a redundant component for a non-redundant component in that memory.

5. The apparatus of claim 2, wherein the fuse box contains two or more fuses and a fuse is a non-volatile storage device that performs the function of a fuse selected from the group consisting of a Flash memory cell, an Electrically Programmable Read Only Memory cell, a one-time programmable memory cell, a few-time programmable memory cell, and a laser fuse.

6. The apparatus of claim 1, wherein the first processor further includes logic internal to the first processor configured to compress an amount of bits making up an actual repair signature for a first memory that has one or more defective memory cells that were actually detected during fault testing of the two or more memories and logic internal to the first processor configured to determine one or more locations of the one or more defective memory cells detected during fault testing and configured to provide error logging, wherein the actual repair signature is generated for each memory having one or more defective memory cells that were actually detected during fault testing, and the field consists of the single bit that identifies the memory, followed by the plurality of bits being compressed.

7. The apparatus of claim 6, wherein the processor further includes logic configured to decompress an amount of bits making up the actual repair signature for the first memory of the two or more memories in the stored concatenated repair signature.

8. The apparatus of claim 2, wherein the processor further includes logic configured to compose the concatenated repair signature for all of the memories sharing the fuse box and configured to identify and allocate available redundant rows of memory cells and redundant columns of memory cells in order to determine an optimum redundancy scheme when a failure occurs, wherein the concatenated repair signature is a compilation of repair signatures for the two or more memories, which is stored in the same repair data container and is stored in a format dependent upon whether one or more defective memory cells were detected during fault testing for that particular memory of the two or more memories.

9. The apparatus of claim 1, wherein the repair data container contains an amount of fuses to store (1) actual repair signatures for an adjustable subset of the redundant components associated with the two or more memories and (2) dummy repair signatures for the remaining memories.

10. The apparatus of claim 1, wherein the repair data container stores indicator bits for each memory sharing the repair data container, and a presence of an active bit in the indicator bits indicates that the repair data container contains an actual repair signature for that memory having a defect and a dummy repair signature is generated for each memory with no defective memory cells in which the field consists of the single bit that identifies the memory.

11. The apparatus of claim 2, wherein the fuse box has a dedicated field for each memory sharing the fuse box, and a presence of an active bit in the dedicated field indicates that the fuse box contains an actual repair signature for that memory having a defect.

12. The apparatus of claim 1, wherein the processor further includes logic configured to provide built in self-test logic, built-in self-diagnosis logic, and reconfiguration data logic.

13. The apparatus of claim 6, further comprises:
   compression/decompression logic external to the repair data container configured to compress an amount of bits making up the actual repair signature and decompress an amount of bits making up the actual repair signature.

14. The apparatus of claim 1, further comprising:
   a second processor containing redundancy allocation logic and is coupled to one or more memories discreet from the two or more memories coupled to the first processor, wherein the repair data container is to store the concatenated repair signature that repairs the memories connected to the first processor as well as the memories connected to the second processor.

15. An apparatus, comprising:
   a repair data container located on a chip, the repair data container to store an actual repair signature for each memory having a defective memory cell;
   two or more memories located on the chip, each memory having redundant components that share the repair data container, wherein the repair data container has an amount of fuses to store the actual repair signatures for an adjustable subset of the two or more memories; and
   a processor, located on the chip, having logic configured to test the memories during each initialization cycle of operation of the chip and to augment the actual repair signature if a new defect is detected, the processor to compose a concatenated repair signature that comprises a string of bits arranged as a plurality of fields one for each memory, for each memory having a defective cell the field consists of one or more bits that identify the memory followed by a plurality of bits being compressed repair signature data for the memory, and for each memory with no defective memory cell the field consists of only one or more bits that identify the memory, wherein the augmented actual repair signature has repair signature data to repair defects detected prior to the operation of the chip as well as defects detected during the initialization cycle of operation of the chip.

16. The apparatus of claim 15, wherein the repair data container also stores dummy repair signatures for each memory with no defective memory cells.

17. The apparatus of claim 16, wherein the processor also contains redundancy allocation logic and is coupled to the repair data container, wherein the repair data container stores a concatenated repair signature that includes the actual repair signatures and the dummy repair signatures.

18. The apparatus of claim 16, further comprising:
wherein the processor coupled is to the repair data container, and the processor contains logic configured to decompress an amount of bits making up the actual repair signatures.

19. The apparatus of claim 18, further comprising:
two or more processors at least including the processor as a first processor and a second processor, wherein the second processor containing logic is configured to test and repair a set of memories connected to the second processor discreet from the memories coupled to the first processor; wherein the repair data container has an amount of fuses to store the actual repair signatures for an adjustable subset of the memories connected to the second processor as well as memories connected to the first processor.

20. An apparatus, comprising:
a first processor containing logic configured to test and repair two or more memories connected to the first processor;
a second processor containing logic configured to test and repair two or more memories connected to the second processor; and
a fuse box configured to store a concatenated repair signature that repairs the memories connected to the first processor as well as the memories connected to the second processor, wherein the concatenated repair signature comprises a string of bits arranged as a plurality of fields one for each memory, for each memory having a defective cell the field consists of one or more bits that identify the memory followed by a plurality of bits being compressed that are the repair signature data for the memory, and for each memory with no defective memory cells the field consists of only one or more bits that identify the memory, and wherein the fuse box contains an amount of non-volatile fuses to provide actual repair capability for only a subset of all of the memories that share the fuse box.

21. The apparatus of claim 20, wherein the first processor contains logic configured to decompress an amount of bits making up the concatenated repair signature.

22. The apparatus of claim 20, wherein the fuse box is located external to the memories.

23. The apparatus of claim 20, wherein the processors and the fuse box are embedded on a single chip.

24. A method, comprising:
composing a concatenated repair signature for two or more memory cores on every cycle a device containing the two or more memory cores is initialized, wherein the concatenated repair signature comprises a string of bits arranged as a plurality of fields one for each memory core, for each memory core having a defective cell the field consists of one or more bits that identify the memory core followed by a plurality of bits being compressed that are the repair signature data for the memory core, and for each memory core with no defective memory cells the field consists of only one or more bits that identify the memory core;
sending the concatenated repair signature to be stored in non-volatile fuses; and
decompressing the concatenated repair signature to send reconfiguration data to the two or more memory cores.

25. The method of claim of 24, further comprising:
storing an actual repair signature for a subset of the two or more memory cores and a dummy repair signature for the remaining memory cores.

26. The method of claim of 24, further comprising:
repairing an adjustable subset of memory cores having redundant elements.

27. An apparatus, comprising:
means for composing a concatenated repair signature for two or more memory cores on every cycle a device containing the two or more memory cores is initialized, wherein the concatenated repair signature comprises a string of bits arranged as a plurality of fields one for each memory core, for each memory core having a defective cell the field consists of one or more bits that identify the memory core followed by a plurality of bits being compressed, which are repair signature data for the memory core, and for each memory core with no defective memory cells the field consists of only one or more bits that identify the memory core;
means for sending the concatenated repair signature for each memory core to be stored in non-volatile fuses; and
means for decompressing the concatenated repair signature to send reconfiguration data to the two or more memory cores.

28. The apparatus of claim of 27, further comprising:
means for storing an actual repair signature for a subset of the two or more memory cores and a dummy repair signature for the remaining memory cores.

29. The apparatus of claim of 27, further comprising:
means for repairing an adjustable subset of memory cores having redundant elements.

30. A machine readable medium that stores data and executable instructions representing an integrated circuit, which when executed by a machine to cause the machine to generate a representation of the integrated circuit including:
a first processor containing logic configured to test and repair two or more memories connected to the first processor;
a second processor containing logic configured to test and repair two or more memories connected to the second processor; and
a fuse box configured to store a concatenated repair signature that repairs the memories connected to the first processor as well as the memories connected to the second processor, wherein the concatenated repair signature comprises a string of bits arranged as a plurality of fields one for each memory, for each memory having a defective cell the field consists of one or more bits that identify the memory followed by a plurality of bits being compressed that are the repair signature data for the memory, and for each memory with no defective memory cells the field consists of only one or more bits that identify the memory, and wherein the fuse box contains an amount of non-volatile fuses to provide actual repair capability for only a subset of all of the memories that share the fuse box.

31. The machine-readable medium of claim 30, wherein the machine-readable medium comprises a memory compiler to provide a layout utilized to generate one or more lithographic masks used in the fabrication of the fuse box and the processors.

32. A machine readable medium that stores data and executable instructions representing an integrated circuit, which when executed by a machine to cause the machine to generate a representation of the integrated circuit including:
  a repair data container located on a chip, the repair data container to store concatenated repair signature; and
  two or more memory cores having redundant components that share the repair data container, wherein the repair data container has an amount of fuses to store the concatenated repair signature for an adjustable subset of the two or more memory cores; and
  a processor having logic configured to test the memory cores during each initialization cycle of their operation and to augment an actual repair signature if a new defect is detected, wherein the concatenated repair signature comprises a string of bits arranged as a plurality of fields one for each memory core, for each memory core having a defective cell the field consists of one or more bits that identify the memory core followed by a plurality of bits being compressed, which are repair signature data for the memory core, and for each memory core with no defective memory cells the field consists of only one or more bits that identify the memory core.

33. The machine-readable medium of claim 32, wherein the machine-readable medium comprises a memory compiler to provide a layout utilized to generate one or more lithographic masks used in the fabrication of the repair data container and the two or more memory cores.

34. A machine readable medium that stores data and executable instructions representing an integrated circuit, which when executed by a machine to cause the machine to generate a representation of the integrated circuit including:
  two or more memories having one or more redundant components associated with each memory, the one or more redundant components include at least one redundant column of memory cells;
  a processor containing redundancy allocation logic to execute one or more repair algorithms to generate a concatenated repair signature for repair of all of the memories coupled to the processor; and
  a repair data container to store the concatenated repair signature, wherein the concatenated repair signature comprises a string of bits arranged as a plurality of fields one for each memory, for each memory having a defective cell the field consists of one or more bits that identify the memory followed by a plurality of bits being compressed, which are repair signature data for the memory, and for each memory with no defective memory cells the field consists of only one or more bits that identify the memory, wherein the repair data container contains an amount of non-volatile fuses to provide actual repair capability for only a subset of all of the memories that share the fuse box.

35. The machine-readable medium of claim 34, wherein the machine-readable medium comprises a memory compiler to provide a layout utilized to generate one or more lithographic masks used in the fabrication of the repair data container, the processor, and the two or more memories.

* * * * *